US010687132B2

(12) United States Patent
Lee et al.

(10) Patent No.: US 10,687,132 B2
(45) Date of Patent: Jun. 16, 2020

(54) SIGNAL TRANSMISSION STRUCTURE FOR SPEAKER

(71) Applicant: FORTUNE GRAND TECHNOLOGY INC., Taoyuan (TW)

(72) Inventors: Ping-Yu Lee, Taoyuan (TW); Shen-Yong Wen, Taoyuan (TW); Ming-Jun Zeng, Taoyuan (TW)

(73) Assignee: FORTUNE GRAND TECHNOLOGY INC. (TW)

(*) Notice: Subject to any disclaimer, the term of this patent is extended or adjusted under 35 U.S.C. 154(b) by 0 days.

(21) Appl. No.: 16/234,751

(22) Filed: Dec. 28, 2018

(65) Prior Publication Data
US 2020/0107093 A1  Apr. 2, 2020

(30) Foreign Application Priority Data
Sep. 28, 2018  (CN) .......................... 2018 1 1140721

(51) Int. Cl.
H04R 1/06 (2006.01)
H05K 1/11 (2006.01)
H01R 12/55 (2011.01)
H04R 9/06 (2006.01)
H01R 4/02 (2006.01)

(52) U.S. Cl.
CPC ............... H04R 1/06 (2013.01); H01R 12/55 (2013.01); H04R 9/06 (2013.01); H05K 1/117 (2013.01); H01R 4/029 (2013.01); H04R 2460/11 (2013.01); H05K 2201/09027 (2013.01); H05K 2201/09063 (2013.01); H05K 2201/10287 (2013.01)

(58) Field of Classification Search
CPC .......... H04R 1/06; H01R 12/55; H01R 4/029; H05K 1/117
See application file for complete search history.

(56) References Cited

U.S. PATENT DOCUMENTS 9,813,821 B1 * 11/2017 Song ........................ H04R 9/06
2009/0190790 A1 * 7/2009 Yamagami ............. H04N 5/642
  381/394
2011/0123061 A1 * 5/2011 Kamimura ............. H04R 9/025
  381/412

* cited by examiner

Primary Examiner — Sunita Joshi
(74) Attorney, Agent, or Firm — Schmeiser, Olsen & Watts, LLP

(57) ABSTRACT

A signal transmission structure for speaker includes a base having two outgoing lead grooves provided on the same side thereof; a magnet member arranged on the base; a voice coil movably disposed over the magnet member; two tinsel leads respectively having an end connected to two opposite sides of the voice coil and another end set in the two outgoing lead grooves; and a signal connection board disposed in the base with two tinsel lead welding pads and two hook-up wire welding pads provided on a top and a bottom surface thereof, respectively. The tinsel lead welding pads are located between the voice coil and the outgoing lead grooves, allowing the two tinsel leads to be separately welded thereto. With the above signal transmission structure for speaker, welding of tinsel leads and hook-up wires thereto can be conveniently performed to reduce labor and time costs.

12 Claims, 4 Drawing Sheets

SIGNAL TRANSMISSION STRUCTURE FOR SPEAKER

CROSS-REFERENCE TO RELATED APPLICATION

This non-provisional application claims priority under 35 U.S.C. § 119(a) on Patent Application No(s). 201811140721.7 filed in China on Sep. 28, 2018, the entire contents of which are hereby incorporated by reference.

FIELD OF THE INVENTION

The present invention relates to a signal transmission structure for speaker, and more particularly, to a signal transmission structure for speaker that enables convenient welding of tinsel leads and hook-up wires thereto at reduced labor and time costs.

BACKGROUND OF THE INVENTION

The signal connection board (i.e. a printed circuit board, PCB) for a speaker having a conventional signal transmission structure is a single-sided PCB and is arranged on a bottom of the base of the speaker. With the conventional signal transmission structure for speaker, tinsel leads therefor must be extended through holes formed on the signal connection board first, and are then welded to electrical pads provided on a bottom surface of the signal connection board. The above tinsel lead welding operation requires increased operating time and is not suitable for automated production of speakers.

It is therefore tried by the inventor to develop an improved signal transmission structure for speaker that enables convenient welding of tinsel leads and hook-up wires thereto at reduced labor and time costs.

SUMMARY OF THE INVENTION

In view of the above-mentioned drawbacks of the conventional signal transmission structure for speaker, a primary object of the present invention is to provide an improved signal transmission structure for speaker that enables convenient welding of tinsel leads and hook-up wires thereto at reduced labor and time costs.

To achieve the above and other objects, the signal transmission structure for speaker according to a preferred embodiment of the present invention includes a base provided with two outgoing lead grooves, which are located on the same side of the base; a magnet member arranged on the base; a voice coil movably disposed over the magnet member; two tinsel leads respectively having an end connected to one of two opposite sides of the voice coil and another end set in one of the two outgoing lead grooves; and a signal connection board disposed in the base and having two tinsel lead welding pads provided on a top surface thereof and two hook-up wire welding pads provided on a bottom surface thereof. The two tinsel lead welding pads are separately electrically connected to the two hook-up wire welding pads and are located between the voice coil and the two outgoing lead grooves, the two tinsel leads being separately welded to the two tinsel lead welding pads.

According to an embodiment of the present invention, the base includes two lead supports, each of which is arranged between the voice coil and one of the two tinsel lead welding pads for supporting one of the two tinsel leads thereon.

According to an embodiment of the present invention, the base includes two first air vents and two second air vents with the voice coil being located between the first and the second air vents. The second air vents are respectively partially covered by the signal connection board disposed in the base and accordingly changed to a shape that is the same as and symmetrical with that of the first air vents.

According to an embodiment of the present invention, the base includes four auxiliary air vents that are arranged around the voice coil and are symmetrical with respect to the voice coil.

According to an embodiment of the present invention, the tinsel lead welding pads are respectively pentagon in shape.

According to an embodiment of the present invention, the base includes a receiving cavity and at least one retaining boss, and the signal connection board includes at least one retaining hole. The retaining boss has a shape corresponding to that of the retaining hole; the signal connection board is disposed in the receiving cavity; and the retaining boss is correspondingly engaged with the retaining hole.

According to an embodiment of the present invention, the signal connection board includes a plurality of retaining holes, and the retaining holes are differently formed to show at least two different shapes.

According to an embodiment of the present invention, the signal connection board is insert-injection molded in the base.

According to an embodiment of the present invention, the signal connection board is U-shaped.

According to the above embodiment of the present invention, the tinsel lead welding pads are arranged at two opposite ends of the U-shaped signal connection board.

According to the above embodiment of the present invention, the tinsel lead welding pads are pentagon in shape.

According to an embodiment of the present invention, the two outgoing lead grooves are so formed that they match a curved shape of the two tinsel leads that are outward extended from the voice coil.

With the above-described signal transmission structure for speaker according to the present invention, welding of tinsel leads and hook-up wires thereto can be conveniently performed to reduce labor and time costs.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
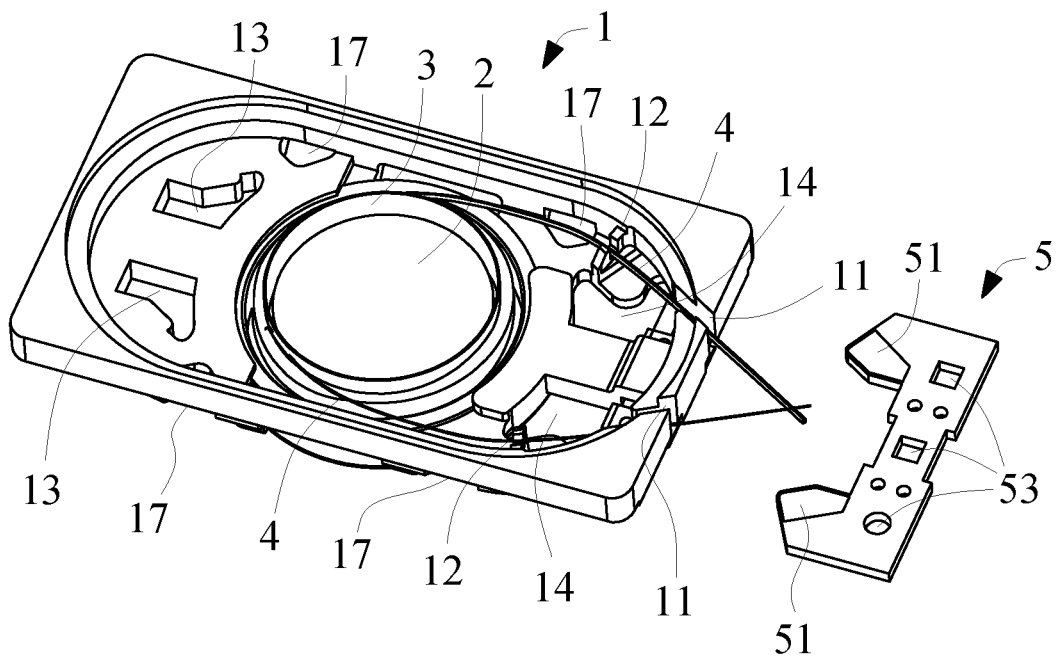
FIG. 1 is an exploded top perspective view of a signal transmission structure for speaker according to a preferred embodiment of the present invention.
Figure 2:
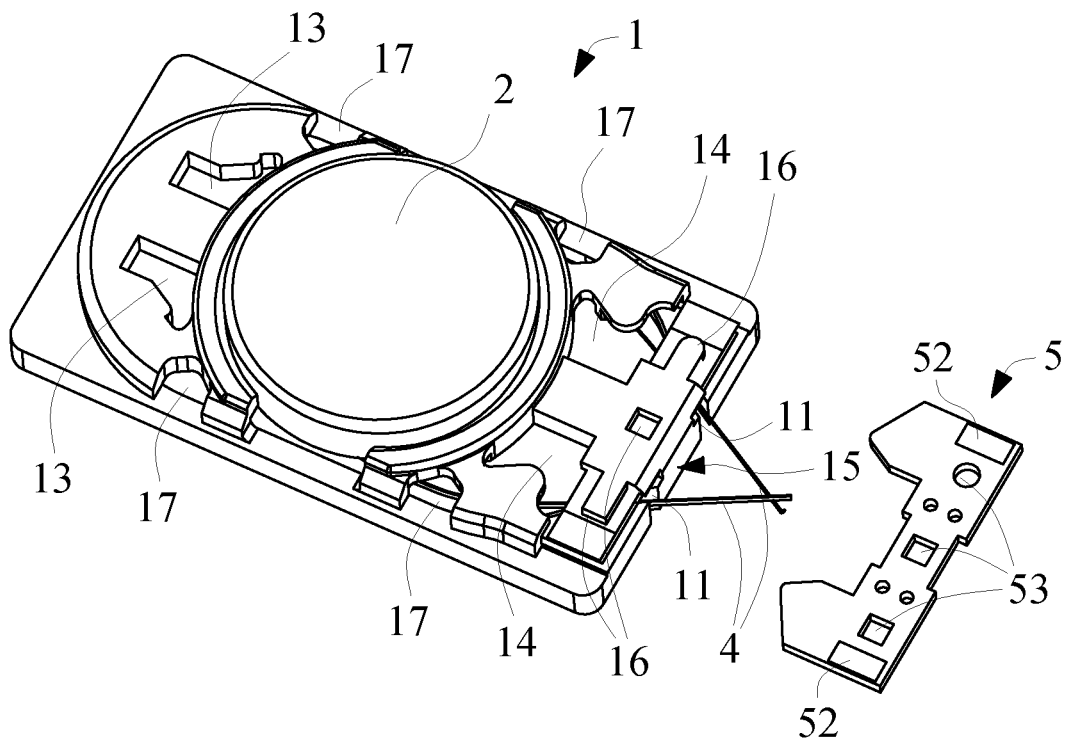
FIG. 2 is an exploded bottom perspective view of the signal transmission structure for speaker according to the preferred embodiment of the present invention.

The present invention will now be described with some preferred embodiments thereof and by referring to the accompanying drawings.

Please refer to FIGS. 1 to 5. As shown, the present invention relates to a signal transmission structure for speaker and can be applied to a rectangular or an oblong thin speaker. The signal transmission structure for speaker according to a preferred embodiment of the present invention includes a base 1, a magnet member 2, a voice coil 3, two tinsel leads 4, and a signal connection board 5 that is a printed circuit board (PCB) in the present invention. The base 1 is provide with two outgoing lead grooves 11, which are located on the same side of the base 1, such as on one shorter side or on one longer side of the base 1 to extend at an angle relative to the side. The magnet member 2 is substantially arranged in a central area of the base 1. The voice coil 3 is movably disposed over the magnetic member 2. The two tinsel leads 4 respectively have an end connected to one of two outgoing ends at two opposite sides of the voice coil 3 and another end set in one of the two outgoing lead receiving grooves 11. Since the tinsel leads 4 have outer surfaces that are electrically conductive layers, they must not contact with each other to avoid undesired electrical connection between them. The tinsel leads 4 have a lead diameter larger than a wire diameter of the wires forming the voice coil, and accordingly, have better structural and tensile strength to be suitably applied to high-power speakers. The signal connection board 5 is a double-sided PCB and is disposed in the base 1. The signal connection board 5 has two tinsel lead welding pads 51 provided on a top surface thereof and two hook-up wire welding pads 52 provided on a bottom surface thereof. The two tinsel lead welding pads 51 are separately electrically connected to the two hook-up wire welding pads 52 and are located between the voice coil 3 and the outgoing lead grooves 11, so that the two tinsel leads 4 can be separately welded to the two tinsel lead welding pads 51. A hook-up wire (not shown) for signal transmission is welded to each of the two hook-up wire welding zones 52.

With the signal transmission structure for speaker according to the present invention as mentioned above, the tinsel leads 4 can be electrically connected to the tinsel lead welding pads 51 on the signal connection board 5 through micro spot welding when the signal connection board 5 is disposed in the base 1. Therefore, the signal transmission structure for speaker according to the present invention facilitates convenient welding of tinsel leads and hook-up wires to the signal connection board 5 to reduce labor and time costs for producing speakers.

Figure 3:
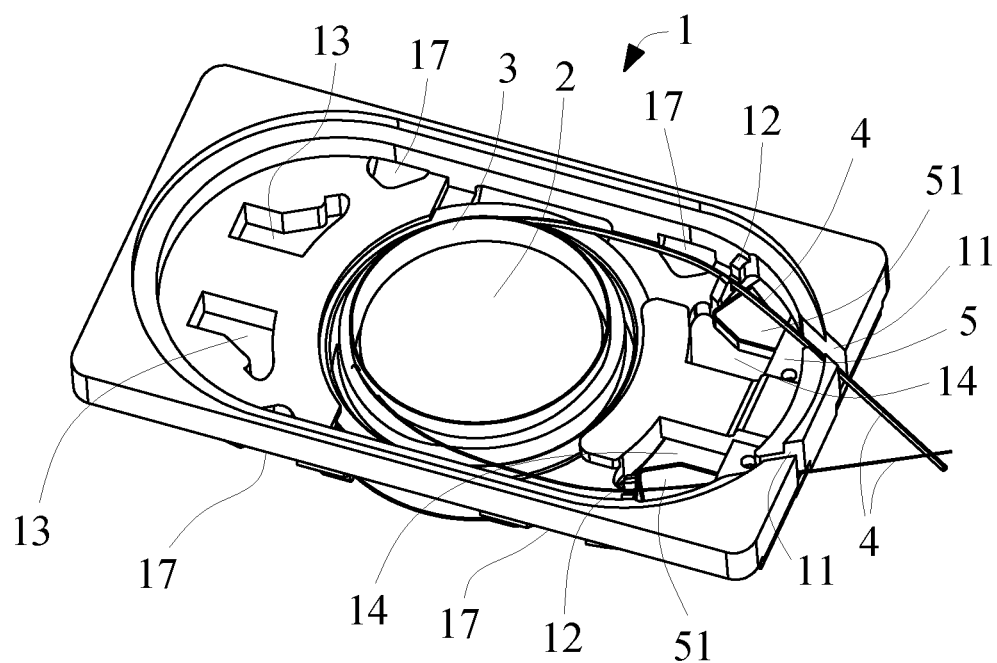
FIG. 3 is an assembled top perspective view of the signal transmission structure for speaker according to the preferred embodiment of the present invention.
Figure 4:
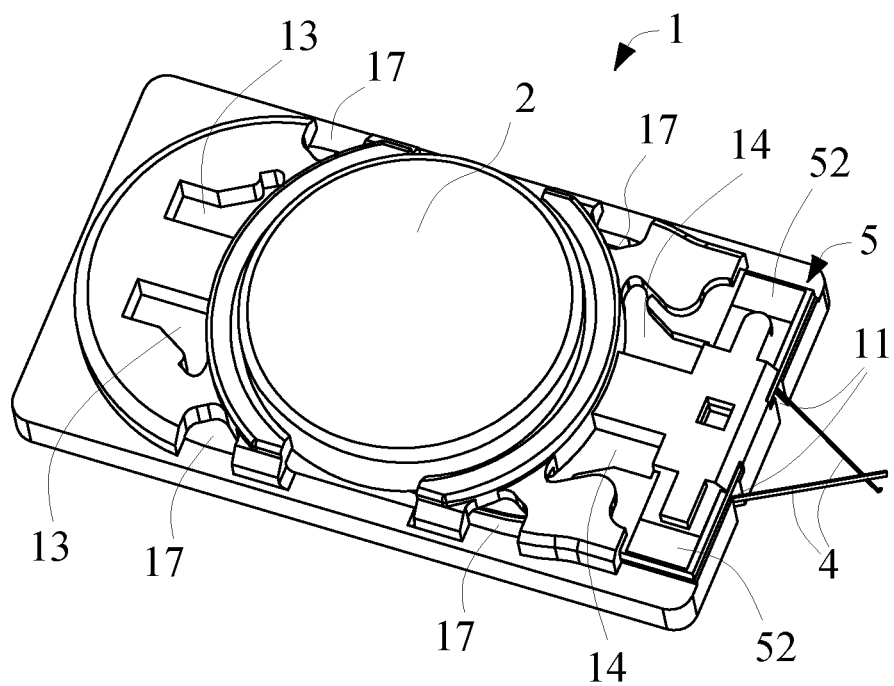
FIG. 4 is an assembled bottom perspective view of the signal transmission structure for speaker according to the preferred embodiment of the present invention.
Figure 5:
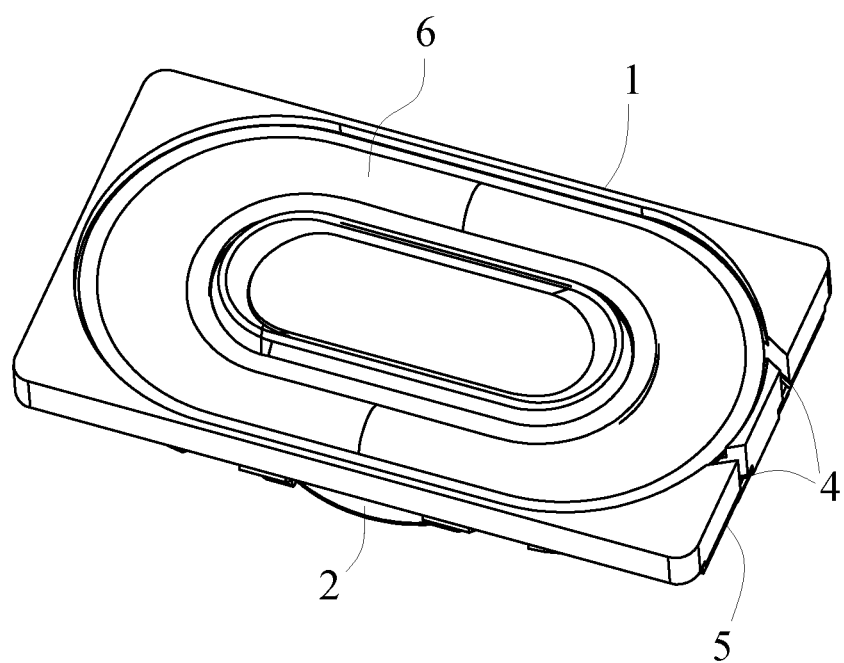
FIG. 5 shows the signal transmission structure for speaker according to the preferred embodiment of the present invention is provided with a diaphragm after tinsel leads extended beyond two outgoing lead grooves as shown in FIG. 3 are cut off.
Figure 6:
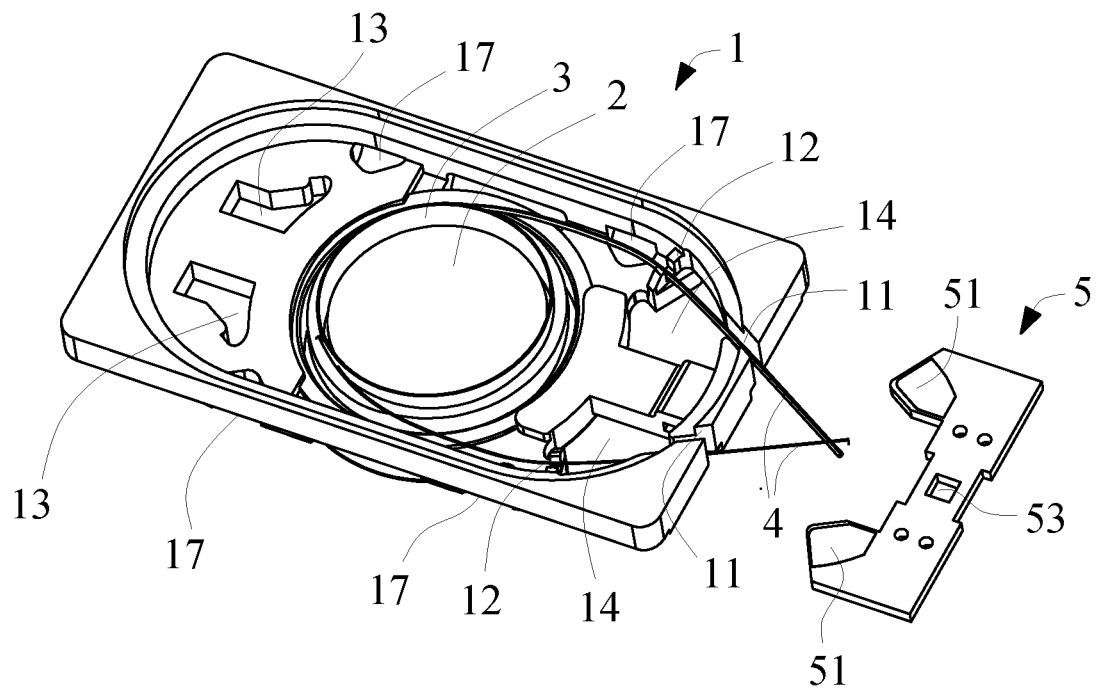
FIG. 6 is an exploded top perspective view showing the signal transmission structure for speaker according to an operable embodiment of the present invention includes a retaining boss and a corresponding retaining hole.
Figure 7:
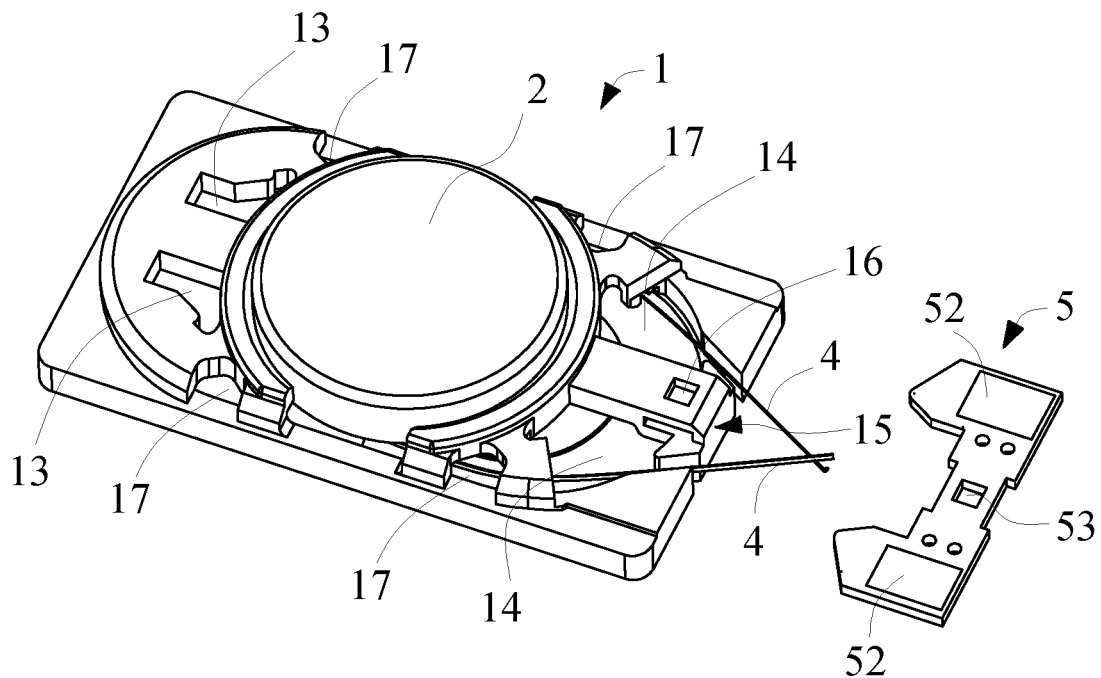
FIG. 7 is a bottom view of FIG. 6 showing the retaining boss and the corresponding retaining hole included in the signal transmission structure for speaker according to the operable embodiment of the present invention.

Please refer to FIGS. 1 and 3. As shown, according to an operable embodiment of the present invention, the base 1 can include two lead supports 12, each of which can be arranged between the voice coil 3 and one of the two tinsel lead welding pads 51 for supporting one tinsel lead 4 thereon. Whereby, the tinsel leads 4 outward extended from the voice coil 3 can respectively maintain their naturally formed curved shape and be supported on the lead supports 12 and set in the outgoing lead grooves 11. Then, the tinsel leads 4 will become suspended over the tinsel lead welding pads 51. Thereafter, the tinsel leads 4 can be quickly spot-welded to the tinsel lead welding pads 51 without the need of being manually extended through any hole for subsequent welding. As shown in FIG. 5, sections of the two tinsel leads 4 that are separately extended beyond the outgoing lead grooves 11 are cut off to avoid any possible electrical contact of the two tinsel leads 4 with each other later. Then, a diaphragm 6 can be provided over the base 1 and connected to the voice coil 3. Alternatively, the sections of the tinsel leads 4 that are extended beyond the tinsel lead grooves 11 can be cut off after the diaphragm 6 is provided over the base 1 and connected to the voice coil 3, in order to avoid any possible electrical contact of the tinsel leads 4 with each other later.

Please refer to FIGS. 1 to 4. As shown, according to another operable embodiment of the present invention, the base 1 can include two first air vents 13 and two second air vents 14. In this case, the voice coil 3 is arranged between the first and the second air vents 13, 14. When the signal connection board 5 is disposed in the base 1, the second air vents 14 are respectively partially covered by the signal connection board 5 and changed to a shape that is the same as and symmetrical with that of the first air vents 13. In other words, the signal connection board 5 has a shape that enables the initially asymmetrical first and second air vents 13, 14 to form two symmetrical structures. With the symmetrical first and second air vents 13, 14, the problem of unbalanced movement of the diaphragm 6 can be minimized to avoid sound distortion, low sound volume and other related problems.

Please refer to FIGS. 1 to 4. As shown, in a further operable embodiment of the present invention, the base 1 can include four auxiliary air vents 17 that are arranged around the voice coil 3 and symmetrical with respect to the voice coil 3. By forming four auxiliary air vents 17 uniformly and annularly distributed around the voice coil 3 (with each auxiliary air vent 17 generally located at a 45-degree angle with respect to an x-axis of the base 1 passing through a center of the voice coil 3), airflow inside the speaker can be evenly discharged in different directions to avoid unexpected sound variation when the speaker is used in different cabinet structures.

Please refer to FIGS. 1 and 3. As shown, according to an operable embodiment of the present invention, the tinsel lead welding pads 51 can be pentagon in shape to have a maximized area each and to facilitate easy tinsel lead spot welding operation thereat.

Please refer to FIGS. 2, 4, 6 and 7. As shown, according to a further operable embodiment of the present invention, the base 1 can include a receiving cavity 15 and at least one retaining boss 16; and the signal connection board 5 can include at least one retaining hole 53. The retaining boss 16 has a shape corresponding to that of the retaining hole 53; the signal connection board 5 is disposed in the receiving cavity 15; and the retaining boss 16 is correspondingly engaged with the retaining hole 53. Further, in the case two or more retaining holes 53 are provided on the signal connection board 5, these retaining holes 53 may be differently formed to show at least two different shapes. By providing retaining holes 53 of different shapes, it is able to ensure a further enhanced connection structure between the signal connection board 5 and the base 1 and to prevent the signal connection board 5 from being disposed in the receiving cavity 15 in a wrong direction. Alternatively, the signal connection board 5 can be insert-injection molded in the base 1. In this case, when two or more retaining holes 53 are provided, these retaining holes 53 can be differently formed to show at least two different shapes, so as to ensure a further enhanced connection structure between the signal connection board 5 and the base 1 and to prevent the signal connection board 5 from being disposed in the injection mold in a wrong direction.

Please refer to FIGS. 1 to 4. As shown, according to another operable embodiment of the present invention, the signal connection board 5 can be U-shaped, which can provide an increased connection area to further enhance the connection structure between the signal connection board 5 and the base 1. In addition, the tinsel lead welding pads 51 can be arranged at two opposite ends of the U-shaped signal connection board 5, so that the two tinsel leads 4 outward extended from the voice coil 3 can respectively maintain their naturally formed curved shape and be quickly welded to the tinsel lead welding pads 51. Again, in this embodiment, the tinsel lead welding pads 51 can be pentagon in shape to have a maximized area each to facilitate easy tinsel lead spot welding operation thereat.

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A signal transmission structure for speaker, comprising:
   a base being provided with two outgoing lead grooves, which are located on the same side of the base;
   a magnet member being arranged on the base;
   a voice coil being movably disposed over the magnet member;
   two tinsel leads respectively having an end connected to one of two opposite sides of the voice coil and another end set in one of the two outgoing lead grooves; and
   a signal connection board being disposed in the base and having two tinsel lead welding pads provided on a top surface thereof and two hook-up wire welding pads provided on a bottom surface thereof; and the two tinsel lead welding pads being separately electrically connected to the two hook-up wire welding pads and being located between the voice coil and the two outgoing lead grooves, the two tinsel leads being separately welded to the two tinsel lead welding pads;
   wherein the base includes a receiving cavity and at least one retaining boss, and the signal connection board includes at least one retaining hole; the retaining boss having a shape corresponding to that of the retaining hole; the signal connection board being disposed in the receiving cavity; and the retaining boss being correspondingly engaged with the retaining hole.

2. The signal transmission structure for speaker as claimed in claim 1, wherein the base includes two lead supports, each of which is arranged between the voice coil and one of the two tinsel lead welding pads for supporting one of the two tinsel leads thereon.

3. The signal transmission structure for speaker as claimed in claim 1, wherein the base includes two first air vents and two second air vents with the voice coil being located between the first and the second air vents; and the second air vents being respectively partially covered by the signal connection board disposed in the base and accordingly changed to a shape that is the same as and symmetrical with that of the first air vents.

4. The signal transmission structure for speaker as claimed in claim 1, wherein the base includes four auxiliary air vents that are arranged around the voice coil and are symmetrical with respect to the voice coil.

5. The signal transmission structure for speaker as claimed in claim 1, wherein the tinsel lead welding pads are respectively pentagon in shape.

6. The signal transmission structure for speaker as claimed in claim 1, wherein the signal connection board includes a plurality of retaining holes, and the retaining holes being differently formed to show at least two different shapes.

7. The signal transmission structure for speaker as claimed in claim 6, wherein the signal connection board is insert-injection molded in the base.

8. The signal transmission structure for speaker as claimed in claim 1, wherein the signal connection board is U-shaped.

9. The signal transmission structure for speaker as claimed in claim 8, wherein the tinsel lead welding pads are arranged at two opposite ends of the U-shaped signal connection board.

10. The signal transmission structure for speaker as claimed in claim 9, wherein the tinsel lead welding pads are pentagon in shape.

11. The signal transmission structure for speaker as claimed in claim 1, wherein the two outgoing lead grooves are so formed that they match a curved shape of the two tinsel leads that are outward extended from the voice coil.

12. A signal transmission structure for speaker, comprising:
    a base being provided with two outgoing lead grooves, which are located on the same side of the base;
    a magnet member being arranged on the base;
    a voice coil being movably disposed over the magnet member;
    two tinsel leads respectively having an end connected to one of two opposite sides of the voice coil and another end set in one of the two outgoing lead grooves; and
    a signal connection board being disposed in the base and having two tinsel lead welding pads provided on a top surface thereof and two hook-up wire welding pads provided on a bottom surface thereof; and the two tinsel lead welding pads being separately electrically connected to the two hook-up wire welding pads and being located between the voice coil and the two outgoing lead grooves, the two tinsel leads being separately welded to the two tinsel lead welding pads;
    wherein the signal connection board is U-shaped, and the tinsel lead welding pads are arranged at two opposite ends of the U-shaped signal connection board.

\* \* \* \* \*